United States Patent
Furukawa et al.

(10) Patent No.: US 10,527,681 B2
(45) Date of Patent: Jan. 7, 2020

(54) DEGRADATION ESTIMATOR FOR ENERGY STORAGE DEVICE, ENERGY STORAGE APPARATUS, INPUT-OUTPUT CONTROL DEVICE FOR ENERGY STORAGE DEVICE, AND METHOD FOR CONTROLLING INPUT AND OUTPUT OF ENERGY STORAGE DEVICE

(71) Applicant: GS Yuasa International Ltd., Kyoto-shi (JP)

(72) Inventors: Kazuki Furukawa, Kyoto (JP); Hiroki Matsui, Kyoto (JP); Seijiro Ochiai, Kyoto (JP); Takaaki Iguchi, Kyoto (JP)

(73) Assignee: GS YUASA INTERNATIONAL LTD., Kyoto-Shi, Kyoto (JP)

( * ) Notice: Subject to any disclaimer, the term of this patent is extended or adjusted under 35 U.S.C. 154(b) by 170 days.

(21) Appl. No.: 15/557,372

(22) PCT Filed: Mar. 30, 2016

(86) PCT No.: PCT/JP2016/060401
§ 371 (c)(1),
(2) Date: Sep. 11, 2017

(87) PCT Pub. No.: WO2016/159087
PCT Pub. Date: Oct. 6, 2016

(65) Prior Publication Data
US 2018/0113174 A1    Apr. 26, 2018

(30) Foreign Application Priority Data

Mar. 31, 2015   (JP) .................................. 2015-073665

(51) Int. Cl.
*G01R 31/392*   (2019.01)
*G01R 31/374*   (2019.01)
(Continued)

(52) U.S. Cl.
CPC ....... *G01R 31/392* (2019.01); *G01R 31/3648* (2013.01); *G01R 31/374* (2019.01);
(Continued)

(58) Field of Classification Search
CPC ................ G01R 31/392; G01R 31/374; G01R 31/3648; H01M 10/486; H01M 10/443;
(Continued)

(56) References Cited

U.S. PATENT DOCUMENTS

| 5,631,533 A | 5/1997 | Imaseki |
| 2011/0112781 A1* | 5/2011 | Anderson ............ G01R 31/392 |
| | | 702/63 |

(Continued)

FOREIGN PATENT DOCUMENTS

| JP | H 07-255133 A | 10/1995 |
| JP | 2003-297435 A | 10/2003 |

(Continued)

OTHER PUBLICATIONS

International Search Report (ISR) (PCT Form PCT/ISA/210), in PCT/JP2016/060401, dated May 31, 2016.

*Primary Examiner* — Drew A Dunn
*Assistant Examiner* — Sailesh Thapa
(74) *Attorney, Agent, or Firm* — McGinn IP Law Group, PLLC

(57) ABSTRACT

It is an object of an embodiment to provide a degradation estimator for an energy storage device, configured to estimate degradation of the energy storage device, an energy storage apparatus, an input-output control device for the energy storage device, and a method for controlling input and output of the energy storage device. The embodiment includes estimating a temporary power decrease rate of the energy storage device in accordance with at least one of an average load, a maximum load, and a ΔSOC obtained from (Continued)

detected current of the energy storage device and detected temperature of the energy storage device.

20 Claims, 12 Drawing Sheets

(51) Int. Cl.
*G01R 31/36* (2019.01)
*H02J 7/00* (2006.01)

(52) U.S. Cl.
CPC ............ *H02J 7/008* (2013.01); *H02J 7/0068* (2013.01); *H02J 7/0091* (2013.01)

(58) Field of Classification Search
CPC ........ H02J 7/008; H02J 7/0068; H02J 7/0091; H02J 7/00
See application file for complete search history.

(56) References Cited

U.S. PATENT DOCUMENTS

| | | | | |
|---|---|---|---|---|
| 2013/0069598 A1* | 3/2013 | Tanaka | .............. | H01M 10/0525 |
| | | | | 320/134 |
| 2013/0271148 A1* | 10/2013 | Maeda | ................. | B60L 3/0046 |
| | | | | 324/426 |
| 2014/0017549 A1* | 1/2014 | Miyazaki | ............. | H01M 4/583 |
| | | | | 429/145 |

FOREIGN PATENT DOCUMENTS

| | | | | |
|---|---|---|---|---|
| JP | 3949488 B2 | * | 7/2007 | ............. B60L 58/16 |
| JP | 2008256642 | * | 10/2008 | |
| JP | 2009095209 | * | 4/2009 | |
| JP | 5268853 B2 | | 8/2013 | |
| JP | 2013-225397 A | | 10/2013 | |
| JP | 2014-032955 A | | 2/2014 | |
| JP | 2014-157662 A | | 8/2014 | |
| JP | 2015-227841 A | | 12/2015 | |
| WO | WO 2014/027389 A1 | | 2/2014 | |

* cited by examiner

DEGRADATION ESTIMATOR FOR ENERGY STORAGE DEVICE, ENERGY STORAGE APPARATUS, INPUT-OUTPUT CONTROL DEVICE FOR ENERGY STORAGE DEVICE, AND METHOD FOR CONTROLLING INPUT AND OUTPUT OF ENERGY STORAGE DEVICE

CROSS REFERENCE TO RELATED APPLICATION

The present application claims priority to Japanese Patent Application No. 2015-73665 which is incorporated by reference.

TECHNICAL FIELD

The present invention relates to a degradation estimator for a chargeable and dischargeable energy storage device, an energy storage apparatus, an input-output control device configured to control input and output of the energy storage device in use, and a method for controlling input and output of the energy storage device.

BACKGROUND ART

There has conventionally been known a charge-discharge control device configured to control charge and discharge of a secondary battery (see Patent Document 1). The charge-discharge control device includes a discharge controller configured to stop discharge when voltage of the discharging secondary battery is less than a predetermined reference value, a charge controller configured to stop charge when voltage of the secondary battery being charged is more than a predetermined reference value, and a record estimator configured to estimate a record (the number of times of charge-discharge or the cycle number) of the secondary battery in accordance with a state of the secondary battery. The discharge controller corrects (increases) the reference value for discharge stop in accordance with a record estimated value provided by the record estimator, and corrects (decreases) the reference value for charge stop in accordance with a record estimated value provided by the record estimator.

In the charge-discharge control device, the record estimator estimates a record in accordance with the state of the secondary battery, and the discharge controller and the charge controller correct a reference voltage value for discharge stop and a reference voltage value for charge stop, respectively, in accordance with the record. The secondary battery thus has less gradual increase in capacity variation (i.e. degradation of the secondary battery is suppressed).

PRIOR ART DOCUMENT

Patent Document

Patent Document 1: JP-A-07-255133

SUMMARY OF THE INVENTION

Problem to be Solved by the Invention

The charge-discharge control device is configured to correct the reference voltage value for discharge stop and the reference voltage value for charge stop only in accordance with the estimated value of the record (the number of times of charge-discharge or the cycle number) of the secondary battery. Degradation of the secondary battery may not sometimes be suppressed due to a level of current upon charge-discharge of the secondary battery.

It is an object of the present embodiment to estimate degradation of an energy storage device.

Means for Solving the Problem

A degradation estimator for an energy storage device according to the present embodiment includes
a first operation unit configured to obtain at least a maximum load from detected current of the energy storage device, in which
the degradation estimator estimates a temporary power decrease rate of the energy storage device in accordance with the maximum load and detected temperature of the energy storage device.

MODE FOR CARRYING OUT THE INVENTION

Figure 13:
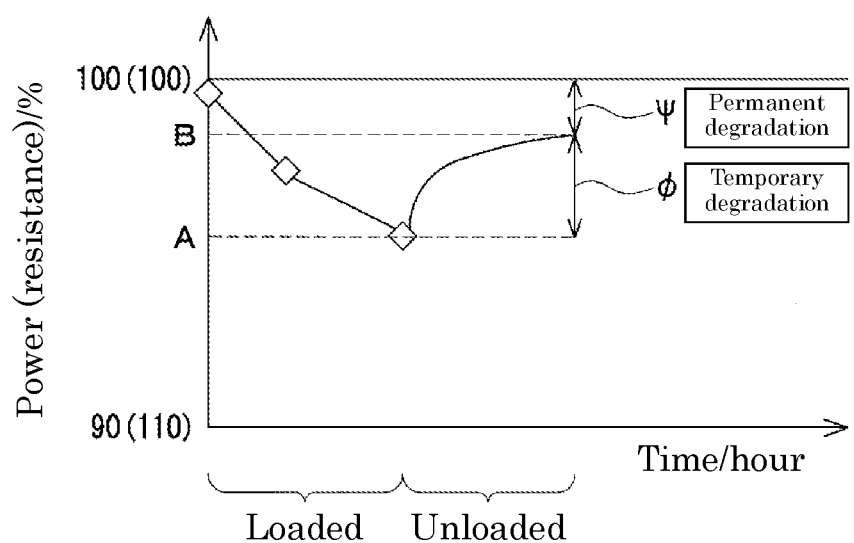
FIG. 13 is an explanatory graph of temporary power decrease.

The inventors of the present invention have focused on the fact that degradation (power decrease) of an energy storage device includes temporary power decrease and permanent power decrease, and large temporary power decrease (a large temporary power decrease rate) influences permanent power decrease not recovering even under an unloaded condition of the energy storage device. Such a temporary power decrease rate relates to recoverable power decrease, and corresponds to, as exemplarily indicated in FIG. 13, a difference (length of an arrow φ in FIG. 13) between power largely decreased by application of a load to the energy storage device (a point A in FIG. 13) and power recovered from the state at the point A under the unloaded condition of the energy storage device for a predetermined period (a point B in FIG. 13). In other words, the temporary power decrease rate relates to a power decrease rate of the energy storage device recovered if the energy storage device is kept under the unloaded condition for a predetermined period while the energy storage device is in use with charge and discharge. In FIG. 13, a permanent power decrease rate at the point B corresponds to length of an arrow Ψ.

Figure 9:
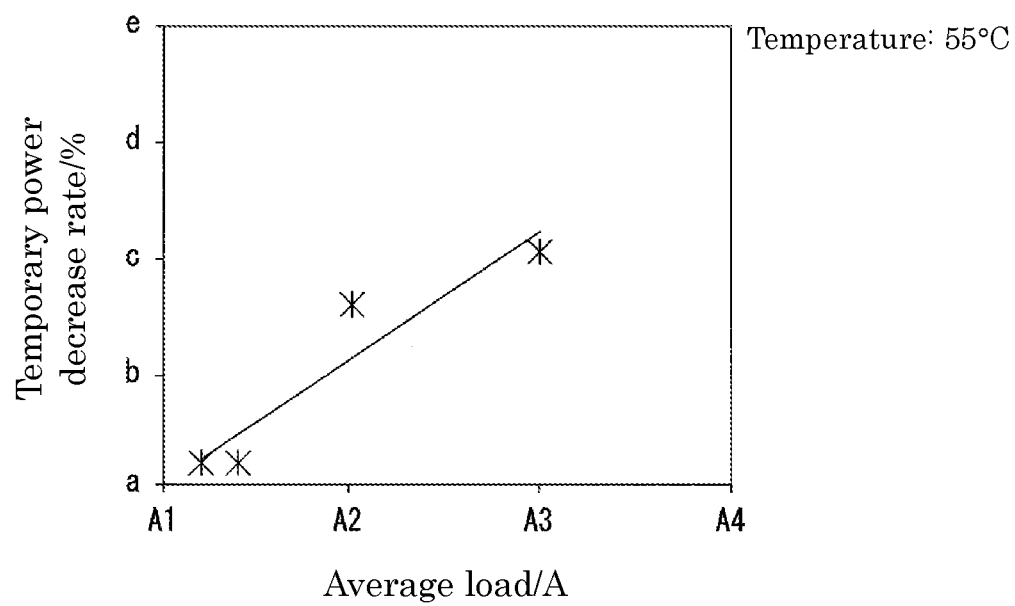
FIG. 9 is a graph indicating a relation between an average load after elapse of 100 hours with a constant load and the temporary power decrease rate.
Figure 10:
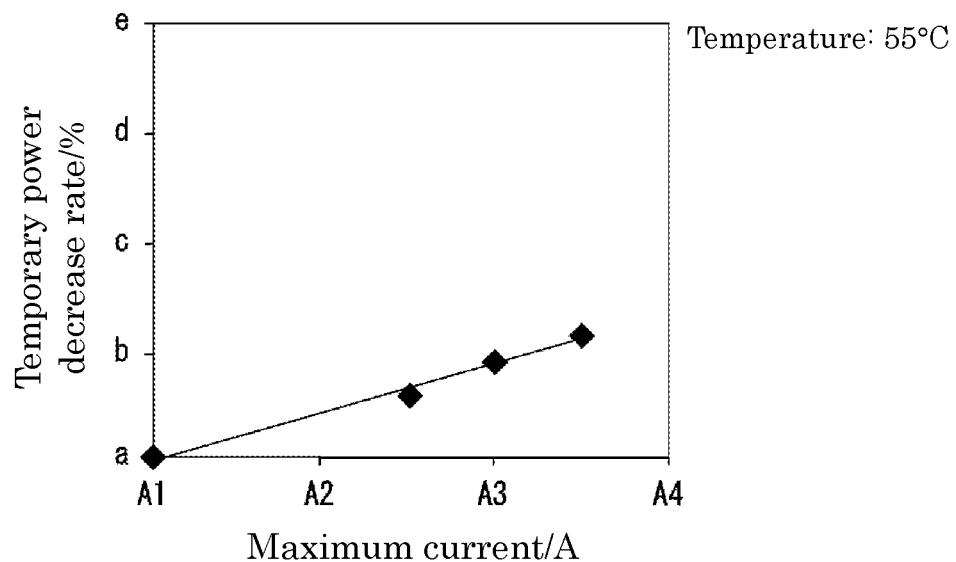
FIG. 10 is a graph indicating a relation between a maximum load after elapse of 100 hours with a constant average load and the temporary power decrease rate.
Figure 11:
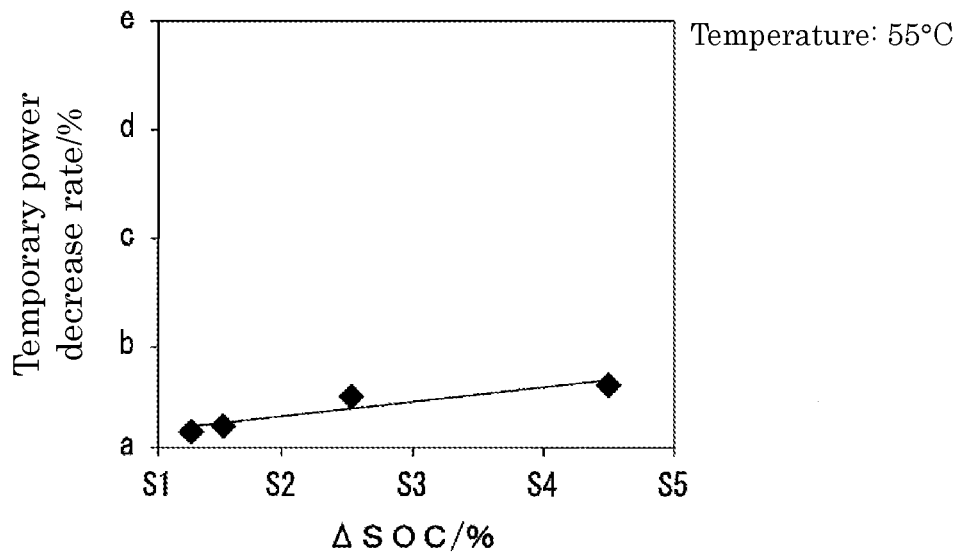
FIG. 11 is a graph indicating a relation between a $\Delta SOC$ after elapse of 100 hours with a constant load and the temporary power decrease rate.
Figure 12:
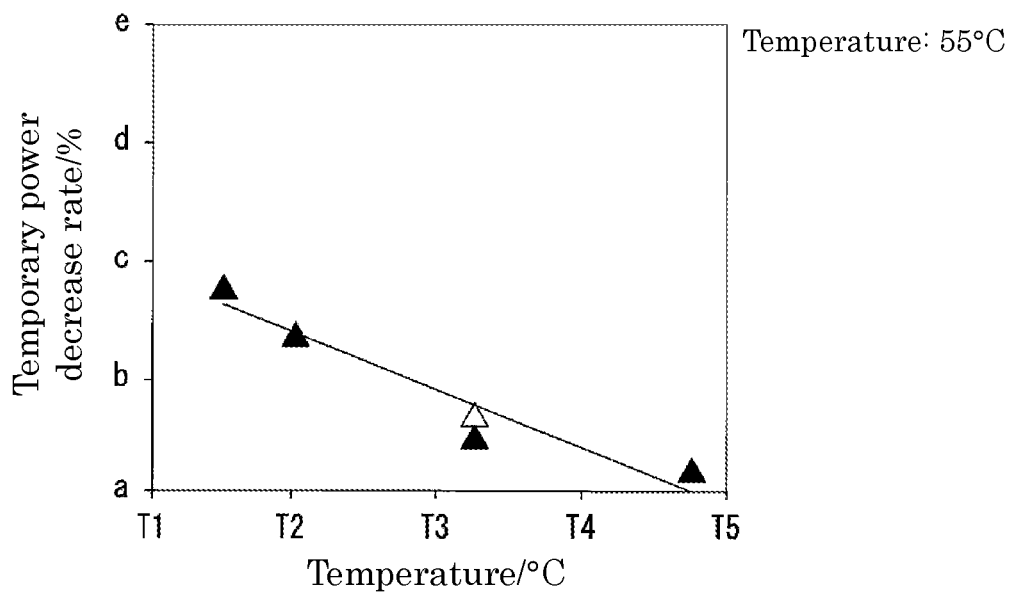
FIG. 12 is a graph indicating a relation between temperature after elapse of 100 hours with a constant load and the temporary power decrease rate.

The inventors have found, through intensive research for achievement of the object mentioned above, that there is a certain correspondence relation between a current record of an energy storage device (specifically, an average load, a maximum load, and a difference between a maximum charge rate and a minimum charge rate (hereinafter, also simply referred to as a "ΔSOC"), which are obtained from a current value of the energy storage device)) and the temporary power decrease rate of the energy storage device, as indicated in FIGS. 9 to 11. The inventors have found that the maximum load of the energy storage device particularly largely influences the temporary power decrease rate of the energy storage device. The inventors have also found that there is a certain correspondence relation between temperature of the energy storage device and the temporary power decrease rate of the energy storage device. The inventors have found, on the basis of these facts, that the temporary power decrease rate of the energy storage device can be estimated from the current record and the temperature of the energy storage device.

A degradation estimator for an energy storage device according to the present embodiment includes a parameter operation unit configured to obtain at least a maximum load from detected current of the energy storage device, in which the degradation estimator estimates a temporary power decrease rate of the energy storage device in accordance with the maximum load and detected temperature of the energy storage device.

The maximum load has a maximum current value in a time interval from ignition on to estimation of the temporary power decrease rate of the energy storage device in a case where the energy storage device and the degradation estimator are mounted on a vehicle. The maximum load is reset upon ignition off.

The present embodiment provides an energy storage apparatus including the degradation estimator and the energy storage device.

An input-output control device for an energy storage device according to the present embodiment includes a degradation estimator including a first operation unit configured to obtain at least one of an average load, a maximum load, and a ΔSOC from detected current of the energy storage device, the degradation estimator being configured to estimate a temporary power decrease rate of the energy storage device in accordance with at least one of the average load, the maximum load, and the ΔSOC obtained by the first operation unit and detected temperature of the energy storage device, in which the input-output control device adjusts current inputted to and outputted from the energy storage device such that an estimated value of the temporary power decrease rate of the energy storage device obtained in accordance with at least one of the average load, the maximum load, and the ΔSOC obtained from the detected current of the energy storage device, and the detected temperature of the energy storage device is equal to or less than a predetermined value.

In this configuration, the current inputted to and outputted from the energy storage device is adjusted in accordance with the temporary power decrease rate of the energy storage device estimated from the current inputted to and outputted from the energy storage device and the temperature of the energy storage device. The temporary power decrease rate of the energy storage device is thus suppressed to be equal to or less than the predetermined value, to suppress degradation of the energy storage device. In other words, the temporary power decrease rate of the energy storage device is obtained (estimated) from the current inputted to and outputted from the energy storage device in use and the temperature of the energy storage device. The current having the correspondence relation with the temporary power decrease rate is adjusted in accordance with the temporary power decrease rate thus obtained (estimated), to suppress the temporary power decrease rate of the energy storage device to be equal to or less than the predetermined value. This suppresses degradation of the energy storage device due to influence of temporary power decrease on permanent power decrease.

Optionally, the input-output control device for the energy storage device further includes a storage unit storing data associating at least one of the average load, the maximum load, and the ΔSOC, with the temperature of the energy storage device and the temporary power decrease rate of the energy storage device, and an adjuster, in which the degradation estimator obtains the estimated value from at least one of the average load, the maximum load, and the ΔSOC obtained by the first operation unit and the detected temperature, with reference to the data, and the adjuster adjusts current inputted to and outputted from the energy storage device such that the estimated value obtained by the degradation estimator is equal to or less than a predetermined value.

In this configuration, the storage unit preliminarily stores the data associating at least one of the average load, the maximum load, and the ΔSOC, with the temperature of the energy storage device and the temporary power decrease rate of the energy storage device. The estimated value is thus obtained only with reference to the data if at least one of the average load, the maximum load, and the ΔSOC, and the temperature of the energy storage device are available. This effectively suppresses an amount of operation to obtain the estimated value of the temporary power decrease rate in accordance with the current and the temperature thus detected (i.e. the amount of operation to obtain the estimated value in accordance with at least one of the average load, the maximum load, and the ΔSOC, and the temperature of the energy storage device).

Alternatively, the input-output control device for the energy storage device further includes an adjuster, in which the degradation estimator includes a second operation unit configured to obtain the estimated value by operation with at least one of the average load, the maximum load, and the ΔSOC obtained by the first operation unit and the detected temperature, and the adjuster adjusts current inputted to and outputted from the energy storage device such that the estimated value obtained by the second operation unit is equal to or less than a predetermined value.

In this configuration, the temporary power decrease rate is obtained (estimated) by operation with the current and the temperature thus detected (specifically, at least one of the average load, the maximum load, and the ΔSOC obtained from the current, and the temperature). The storage unit thus does not need to have an area or the like storing the data associating the average load, the maximum load, and the ΔSOC, with the temperature of the energy storage device and the temporary power decrease rate of the energy storage device. This leads to simplification in configuration.

In the input-output control device for the energy storage device, optionally, the adjuster adjusts the current to adjust at least the maximum load out of the average load, the maximum load, and the ΔSOC.

Among the average load, the maximum load, and the ΔSOC, the maximum load most influences temporary power decrease of the energy storage device (see FIGS. 9 to 11 or the like). The temporary power decrease rate of the energy storage device can effectively be adjusted in the above configuration for adjustment of at least the maximum load.

In the input-output control device for the energy storage device, the predetermined value can be from 0% to 10%. The predetermined value in this case is based on power at the beginning of life (BOL). The power at the BOL indicates power immediately after shipment of a battery module or a battery pack, or power substantially with neither permanent power decrease nor temporary power decrease after charge-discharge of the battery module or the battery pack for several times.

This configuration preferably suppresses transition from temporary power decrease to permanent power decrease. This suppresses degradation of the energy storage device.

In this case, the predetermined value can be 5%.

Figure 8:
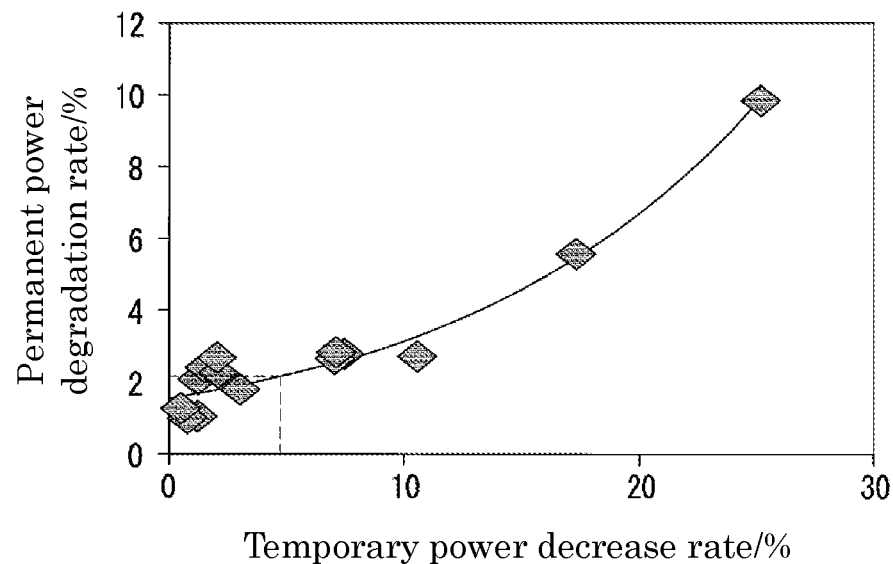
FIG. 8 is a graph indicating a relation between a temporary power decrease rate and a permanent power decrease rate.

When the temporary power decrease rate exceeds a fixed value, temporary power decrease more influences permanent power decrease (see FIG. 8 or the like). The above configuration thus preferably suppresses influence of temporary power decrease on permanent power decrease. This more preferably suppresses degradation of the energy storage device.

A method for controlling input and output of an energy storage device includes detecting current inputted to and outputted from the energy storage device, detecting temperature of the energy storage device, obtaining an estimated value of a temporary power decrease rate of the energy storage device in accordance with at least one of an average load, a maximum load, and a ΔSOC obtained from the detected current, and the detected temperature, and adjusting current inputted to and outputted from the energy storage device such that the obtained estimated value of the temporary power decrease rate is equal to or less than a predetermined value.

In this configuration, the current inputted to and outputted from the energy storage device is adjusted in accordance with the temporary power decrease rate of the energy storage device estimated from the current inputted to and outputted from the energy storage device and the temperature of the energy storage device. The temporary power decrease rate of the energy storage device is thus suppressed to be equal to or less than the predetermined value, to suppress degradation of the energy storage device. The temporary power decrease rate of the energy storage device can be obtained (estimated) from the current inputted to and outputted from the energy storage device in use and the temperature of the energy storage device. The current having the correspondence relation with the temporary power decrease rate is adjusted in accordance with the temporary power decrease rate thus obtained (estimated), to suppress the temporary power decrease rate of the energy storage device to be equal to or less than the predetermined value. This suppresses degradation of the energy storage device due to influence of temporary power decrease on permanent power decrease.

In the method for controlling input and output of the energy storage device, obtaining the estimated value optionally includes obtaining at least one of the average load, the maximum load, and the ΔSOC of the energy storage device from the detected current, and obtaining the estimated value from at least one of the average load, the maximum load, and the ΔSOC thus obtained and the detected temperature, with reference to preset data associating at least one of the average load, the maximum load, and the ΔSOC with the temperature of the energy storage device and the temporary power decrease rate of the energy storage device.

The data associating at least one of the average load, the maximum load, and the ΔSOC, with the temperature of the energy storage device and the temporary power decrease rate of the energy storage device is preliminarily obtained, to enable obtaining the estimated value only with reference to the data if at least one of the average load, the maximum load, and the ΔSOC of the energy storage device, and the temperature of the energy storage device are available. This effectively suppresses an amount of operation to obtain the estimated value of the temporary power decrease rate in accordance with the current and the temperature thus detected (i.e. the amount of operation to obtain the estimated value in accordance with at least one of the average load, the maximum load, and the ΔSOC, and the temperature of the energy storage device).

In the method for controlling input and output of the energy storage device, obtaining the estimated value optionally includes obtaining at least one of the average load, the maximum load, and the ΔSOC of the energy storage device from the detected current, and obtaining the estimated value by operation with at least one of the average load, the maximum load, and the ΔSOC thus obtained and the detected temperature.

In this configuration, the temporary power decrease rate is obtained (estimated) by operation with the current and the temperature thus detected (specifically, at least one of the average load, the maximum load, and the ΔSOC obtained from the current, and the temperature). The storage unit thus does not need to have an area or the like storing the data associating the average load, the maximum load, and the ΔSOC, with the temperature of the energy storage device and the temporary power decrease rate of the energy storage device. This leads to simplification in configuration.

As described above, the present embodiment achieves estimation and suppression of degradation of an energy storage device.

A first embodiment of the present invention will be described below with reference to FIGS. 1 to 5. Names of constituent members (constituent elements) according to the present embodiment are effective in the present embodiment, and can be different from names of constituent members (constituent elements) according to the background art.

An input-output control device for an energy storage device according to the present embodiment (hereinafter, simply referred to as the "input-output control device") can be mounted on a hybrid vehicle driven by an engine and a motor. Initially described below is the energy storage device as an input-output control target of the input-output control device.

Figure 1:
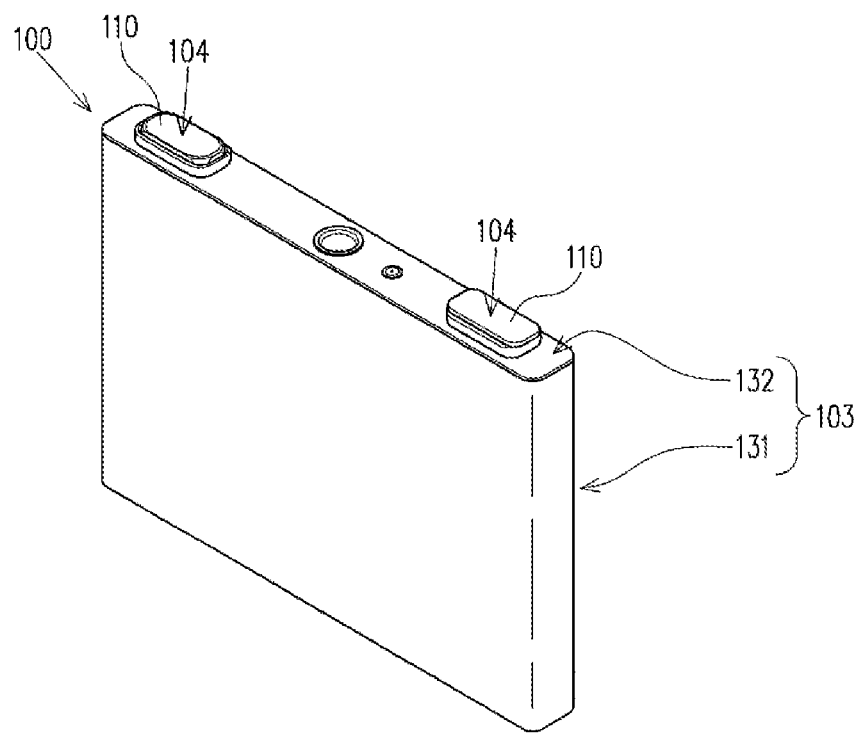
FIG. 1 is a perspective view of an energy storage device to be charged by an input-output control device according to a first embodiment.
Figure 1:
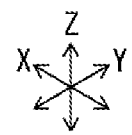
Figure 2:
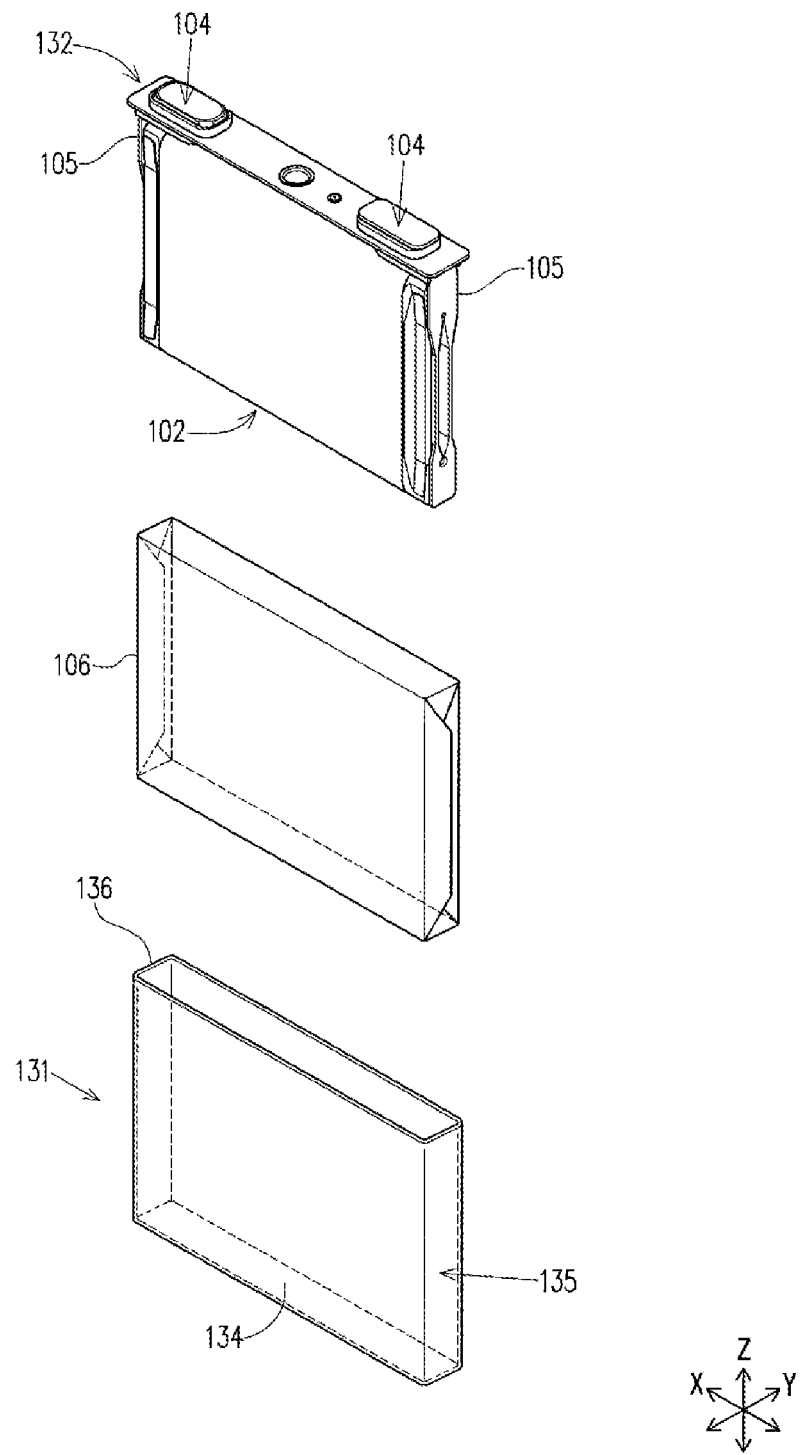
FIG. 2 is an exploded perspective view of the energy storage device.
Figure 3:
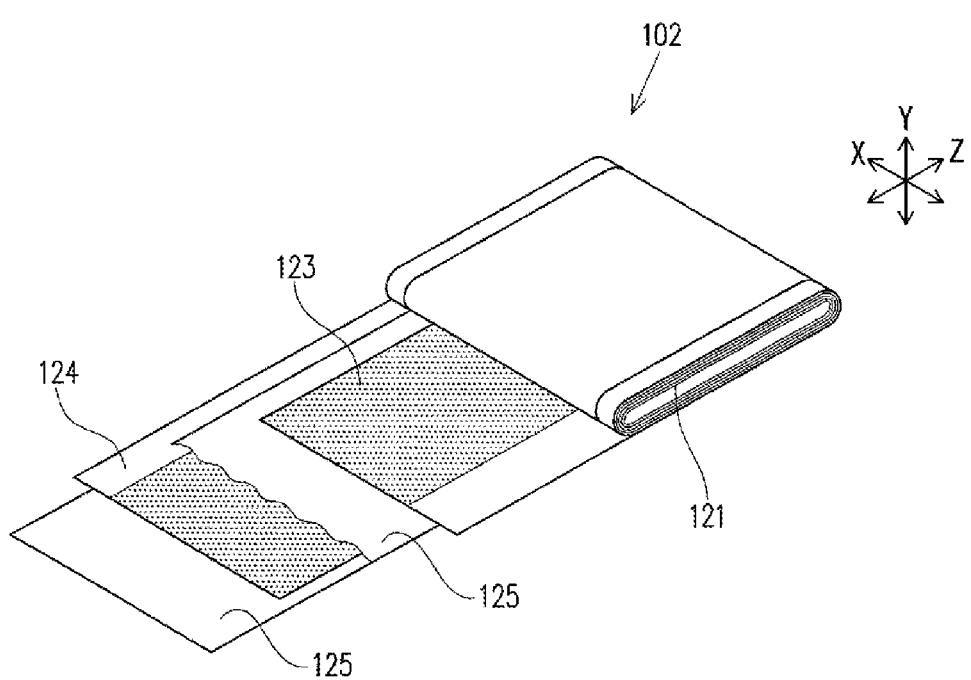
FIG. 3 is an explanatory view of an electrode assembly of the energy storage device.

The energy storage device according to the present embodiment is a nonaqueous electrolyte secondary battery, specifically, a lithium ion battery. The energy storage device is, however, not limited to the lithium ion battery. Examples of the energy storage device include a battery other than the lithium ion battery, which has temporary power decrease similarly to the lithium ion battery, and a capacitor. As depicted in FIGS. 1 to 3, the energy storage device includes an electrode assembly 102 having a positive electrode 123 and a negative electrode 124, a case 103 accommodating the electrode assembly 102, and an external terminal 104 disposed outside the case 103. An energy storage device 100 further includes a current collector 105 configured to cause the electrode assembly 102 and the external terminal 104 to be conducted each other.

The electrode assembly 102 includes a winding core 121, and the positive electrode 123 and the negative electrode 124 insulated from each other and wound around the winding core 121. The energy storage device 100 is charged or discharges by migration of lithium ions between the positive electrode 123 and the negative electrode 124 in the electrode assembly 102.

The positive electrode 123 has metal foil and a positive active material layer provided on the metal foil. The metal foil has a belt shape. Examples of the metal foil according to the present embodiment include aluminum foil.

The positive active material according to the present embodiment is lithium metal oxide. The positive active material can alternatively be an active material of a two-phase reaction type. Specifically, the positive active material is expressed by a general formula of $LiMPO_4$, in which M can be any one of Fe, Mn, Cr, Co, Ni, V, Mo, and Mg.

Examples of the positive active material include a polyanion compound ($LiaFebPO_4$, $LiaMnbPO_4$, $LiaMnbSiO_4$, $LiaCobPO_4F$, or the like) expressed by LiaMeb(XOc)d (Me indicates one or at least two transition metals, and X indicates P, Si, B, V, or the like) including the active material of the two-phase reaction type. The examples of the positive active material further include composite oxide ($LixCoO_2$, $LixNiO_2$, $LixMnO_4$, $LixNiyMnzCo(1-y-z)O_2$, or the like) expressed by LixMeOp (Me indicates one or at least two transition metals).

The negative electrode 124 has metal foil and a negative active material layer provided on the metal foil. The metal foil has a belt shape. Examples of the metal foil according to the present embodiment include copper foil.

The negative active material according to the present embodiment is a carbonaceous material. Specifically, the negative active material can be any one of graphite, easily graphitizable carbon, hardly graphitizable carbon, and the like.

In the electrode assembly 102 according to the present embodiment, the positive electrode 123 and the negative electrode 124 configured as described above are wound while being insulated from each other by a separator 125. In other words, the positive electrode 123, the negative electrode 124, and the separator 125 are layered and wound in the electrode assembly 102 according to the present embodiment. The separator 125 is an insulating member. The separator 125 is disposed between the positive electrode 123 and the negative electrode 124. The positive electrode 123 and the negative electrode 124 are thus insulated from each other in the electrode assembly 102. The separator 125 holds electrolyte solution in the case 103. When the energy storage device 100 is charged or discharges, lithium ions migrate between the positive electrode 123 and the negative electrode 124 alternately layered with the separator 125 being interposed therebetween.

The electrode assembly 102 according to the present embodiment includes the separator 125 of a high-power type adapted to the energy storage device having a large current flow. In the present embodiment, degradation estimation and current control to be described later lead to suppression of temporary power decrease. The separator 125 has air resistance of 50 to 600 sec/100 cc. The energy storage device mounted on a hybrid vehicle is provided with the separator 125 having air resistance of 100 to 300 sec/100 cc. A separator having less air resistance is likely to achieve higher power and less temporary power decrease.

The electrode assembly 102 is not limited to the wound type. The electrode assembly can alternatively be of a stacked type including a tabular positive electrode, a separator, and a tabular negative electrode being layered.

The case 103 includes a case body 131 having an opening, and a lid plate 132 blocking (closing) the opening of the case body 131. The case 103 is formed by joining an opening peripheral edge 136 of the case body 131 and a peripheral edge of the lid plate 132 overlapped each other. The case 103 has an internal space defined by the case body 131 and the lid plate 132. The case 103 accommodates, in the internal space, the electrode assembly 102, the current collector 105, and the like, as well as the electrolyte solution.

The case body 131 includes a blocking portion 134 having a rectangular plate shape, and a square tube trunk portion 135 connected to a peripheral edge of the blocking portion 134. The case body 131 thus has a square tube shape (i.e. a bottomed square tube shape) having a blocked end along the opening (in a Z axis direction).

The lid plate 132 is a plate member blocking the opening of the case body 131. Specifically, the lid plate 132 has an outline shape corresponding to the opening peripheral edge 136 of the case body 131. The lid plate 132 is thus a rectangular plate member. The peripheral edge of the lid plate 132 is overlapped with the opening peripheral edge 136 of the case body 131 such that the lid plate 132 blocks the opening of the case body 131. Hereinafter, assume that, as depicted in FIG. 1, the lid plate 132 has a long side extending along an X axis on rectangular coordinates, the lid plate 132 has a short side extending along a Y axis on the rectangular coordinates, and the lid plate 132 has a normal line extending along the Z axis on the rectangular coordinates.

The external terminal 104 is electrically connected with an external terminal of another energy storage device, external equipment, or the like. The external terminal 104 is provided as a conductive member. The external terminal 104 can be made of a highly weldable metal material such as an aluminum-based metal material like aluminum or aluminum alloy, or a copper-based metal material like copper or copper alloy.

The current collector 105 is disposed in the case 103 and is connected directly or indirectly to the electrode assembly 102 so as to be conductive with each other. The current collector 105 is provided as a conductive member and is disposed along an inner surface of the case 103.

The energy storage device 100 includes an insulating member 106 insulating the electrode assembly 102 from the case 103. The insulating member 106 according to the present embodiment has a bag shape. The insulating member 106 is disposed between the case 103 (specifically, the case body 131) and the electrode assembly 102. The insulating member 106 according to the present embodiment can be made of resin such as polypropylene or polyphenylene sulfide. In the energy storage device 100 according to the present embodiment, the case 103 accommodates the electrode assembly 102 (the electrode assembly 102 and the current collector 105) accommodated in the bag-shaped insulating member 106.

The input-output control device configured to control input and output of the energy storage device 100 will be described next with reference also to FIGS. 4 and 5.

Figure 4:
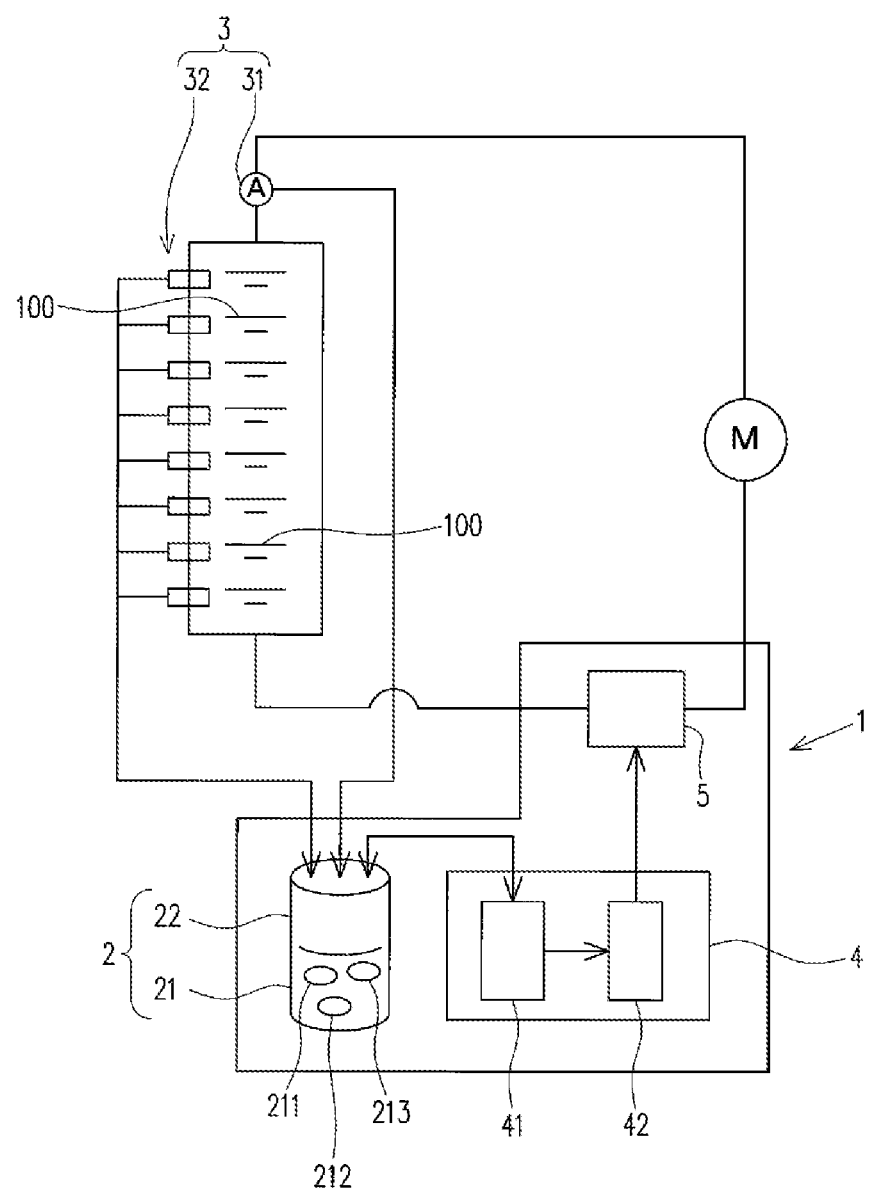
FIG. 4 is a schematic configuration diagram of the input-output control device.
Figure 5:
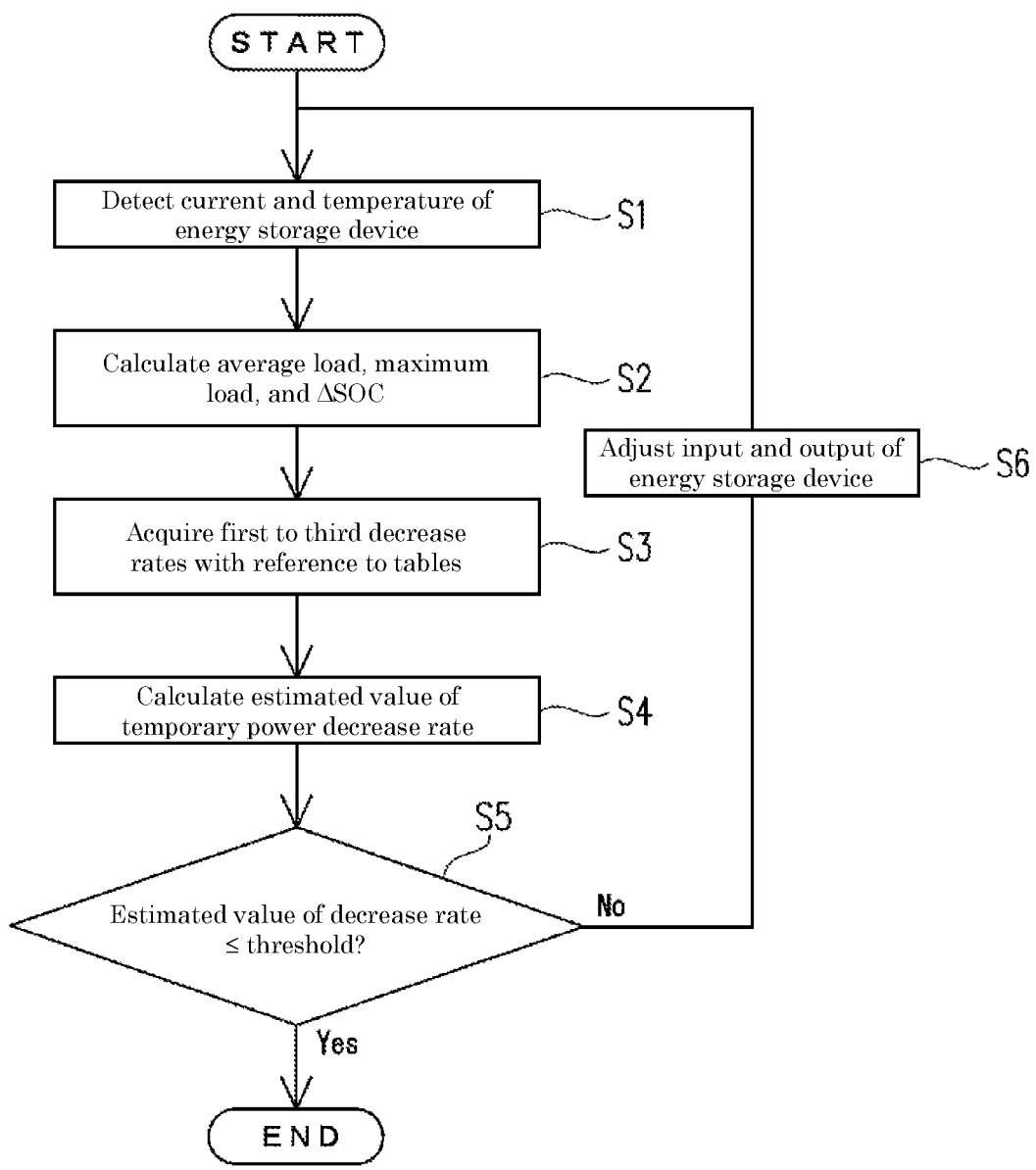
FIG. 5 is a flowchart depicting a flow of controlling the energy storage device by the input-output control device.

As depicted in FIG. 4, the input-output control device includes a storage unit 2 storing a table (information) or the like on a temporary power decrease rate of the energy storage device obtained in accordance with detected current of the energy storage device 100, an operation unit 4 (degradation estimator) configured to obtain the temporary power decrease rate from the detected current, and an adjuster 5 configured to adjust input and output (current in the present embodiment) of the energy storage device 100 in accordance with the operation result of the operation unit 4. An input-output control device 1 according to the present embodiment further includes a detector 3 configured to detect (measure) current inputted to and outputted from the energy storage device 100, and temperature of the energy storage device 100. The input-output control device 1 can alternatively be configured to acquire the current and the temperature from a measuring instrument or the like provided for a different purpose, without including the detector 3.

The storage unit 2 has a first area 21 storing drawable data (information) such as various tables, and a second area 22 storing various drawable data (information) (i.e. configured to temporarily store received data). The storage unit 2 according to the present embodiment is embodied by a hard disk, a memory, or the like.

The first area 21 stores a plurality of (three in the present embodiment) tables (first to third tables). A first table 211 has data associating an average load of the energy storage device 100 and temperature of the energy storage device 100, with a temporary power decrease rate of the energy storage device 100 corresponding to values of the average load and the temperature. A second table 212 has data associating a maximum load of the energy storage device 100 and temperature of the energy storage device 100, with a temporary power decrease rate of the energy storage device 100 corresponding to values of the maximum load and the temperature. A third table 213 has data associating a difference between a maximum charge rate and a minimum charge rage of the energy storage device 100 (hereinafter, also simply referred to as a "ΔSOC") and temperature of the energy storage device 100, with a temporary power decrease rate of the energy storage device 100 corresponding to values of the ΔSOC and the temperature. The average load, the maximum load, and the ΔSOC in the tables 211 to 213 are obtained from detected current (a current record) and detected temperature of the energy storage device 100.

The tables (data) 211 to 213 are prepared with values (data) and the like obtained by a test or simulation with use of the energy storage device 100 to be charged by the input-output control device 1. The tables 211 to 213 are preliminarily stored in the storage unit 2 (specifically, the first area 21) of the input-output control device 1. The tables 211 to 213 are set in accordance with a test result.

The second area 22 stores current and temperature (specifically, current value data on current inputted to and outputted from the energy storage device 100, temperature data on detected temperature of the energy storage device 100, and the like) transmitted from the detector 3. The second area 22 stores information associated with time, on current (a current value or the like) and temperature sequentially transmitted from the detector 3 as elapse of time. The second area 22 accordingly includes a current record (e.g. variation in current value with time transition), and a temperature record (e.g. variation in temperature with time transition) of the energy storage device 100. The second area 22 stores, in a drawable manner, a current value and temperature (specifically, current value data and temperature data) at an arbitrary time point in the current record and the temperature record.

The detector 3 includes a current detector 31 configured to detect current inputted to and outputted from the energy storage device 100, and a temperature detector 32 configured to detect temperature of the energy storage device 100. Specifically, the current detector 31 detects the current flowing in entirety of a plurality of energy storage devices 100 by means of an ammeter, and outputs (transmits), to the storage unit 2, a current value signal indicating the current detected each time. The current detector 31 detects current upon charge of the energy storage device 100 and current upon discharge of the energy storage device 100. The temperature detector 32 detects temperature of each of the energy storage devices 100 and outputs (transmits), to the storage unit 2, a temperature signal indicating the detected temperature of each of the energy storage devices. Temperature of each of the energy storage devices 100 may not be detected but temperature of some of the energy storage devices 100 can alternatively be detected.

The operation unit (degradation estimator) 4 includes a parameter operation unit 41 configured to obtain (calculate) a parameter for obtainment of a temporary power decrease rate in accordance with the current value signal received from the detector 3, and an estimated value operation unit 42 configured to obtain an estimated value of the temporary power decrease rate of the energy storage device 100 in accordance with the parameter obtained by the parameter operation unit 41. The operation unit 4 according to the present embodiment obtains a predetermined power decrease rate as the estimated value of the temporary power decrease rate.

The parameter operation unit 41 obtains (calculates) at least one of an average load, a maximum load, and a ΔSOC of the energy storage device 100 of which current is detected, in accordance with the current value signal stored in the storage unit 2 (the current value signal received from the detector 3). The parameter operation unit 41 according to the present embodiment appropriately draws, from the storage unit 2, a necessary current value in the current record (chronological variation in current value) stored (configured) in the second area 22 of the storage unit 2, and obtains (calculates) an average load, a maximum load, and a ΔSOC in a predetermined period.

The estimated value operation unit 42 obtains a temporary power decrease rate of the energy storage device 100 (the energy storage device 100 of which current and temperature are detected for obtainment of the average load and the like), from at least one of the average load, the maximum load, and the ΔSOC obtained by the parameter operation unit 41 and the temperature signal stored in the storage unit 2 (the temperature signal received from the detector 3), in accordance with a corresponding one of the first to third tables 211 to 213 stored in the storage unit 2. The estimated value operation unit 42 according to the present embodiment acquires, from the first table 211, a value (a first decrease rate) corresponding to the average load obtained by the parameter operation unit 41, acquires, from the second table 212, a value (a second decrease rate) corresponding to the maximum load obtained by the parameter operation unit 41, and acquires, from the third table 213, a value (a third decrease rate) corresponding to the ΔSOC obtained by the parameter operation unit 41. The estimated value operation unit 42 obtains a temporary power decrease rate of the energy storage device 100 in accordance with the first to third decrease rates.

The estimated value operation unit 42 refers to the first table 211 stored in the storage unit 2 and obtains the first decrease rate corresponding to the average load obtained by the parameter operation unit 41 and the temperature detected by the detector 3. The estimated value operation unit 42 refers to the second table 212 stored in the storage unit 2 and obtains the second decrease rate corresponding to the maximum load obtained by the parameter operation unit 41 and the temperature detected by the detector 3. The estimated value operation unit 42 refers to the third table 213 stored in the storage unit 2 and obtains the third decrease rate corresponding to the ΔSOC obtained by the parameter operation unit 41 and the temperature detected by the detector 3. The estimated value operation unit 42 obtains a sum of the obtained first to third decrease rates, and obtains (calculates) a temporary power decrease rate of the energy storage device 100 in accordance with the sum.

The storage unit 2 can be disposed apart from the operation unit 4. In such a case, the storage unit 2 and the operation unit 4 can wiredly or wirelessly communicate with each other.

The operation unit 4 can include a controller provided with a central processing unit (CPU) and a memory storing a necessary operation program.

The adjuster 5 adjusts current inputted to and outputted from the energy storage device 100 such that the estimated value of the temporary power decrease rate (hereinafter, also simply referred to as "the estimated value of the decrease rate") obtained by the operation unit 4 (specifically, the estimated value operation unit 42) is equal to or less than a threshold (a predetermined value: preferably 5% and more preferably 2%).

The adjuster 5 according to the present embodiment varies the current (the current value) inputted to and outputted from the energy storage device 100 and adjusts at least the maximum load out of the average load, the maximum load, and the ΔSOC, to adjust the temporary power decrease rate of the energy storage device 100. The adjuster 5 adjusts the current inputted to and outputted from the energy storage device 100 in accordance with the estimated value of the decrease rate obtained by the operation unit 4, to cause the temporary power decrease rate of the energy storage device 100 to be equal to or less than the threshold.

Control of input and output of the energy storage device 100 by the input-output control device 1 will be described next with reference also to FIG. 5.

When a hybrid vehicle starts due to ignition on, the input-output control device 1 mounted on the vehicle also starts operation. The detector 3 accordingly starts detecting current inputted to and outputted from each of the energy storage devices 100 and starts detecting temperature of each of the energy storage devices 100 (step S1). Detection of current and temperature of each of the energy storage devices 100 is continued until the hybrid vehicle stops due to ignition off.

When detection of current and temperature starts, the parameter operation unit 41 obtains an average load, a maximum load, and a ΔSOC of each of the energy storage devices 100 in accordance with the detected current (step S2). Specifically, the parameter operation unit 41 obtains the average load, the maximum load, and the ΔSOC from start to stop of the vehicle.

The estimated value operation unit 42 subsequently obtains a temporary power decrease rate, from the average load, the maximum load, and the ΔSOC obtained by the parameter operation unit 41 and the temperature of the energy storage device 100 detected by the detector 3 and stored in the storage unit 2 (the second area 22), with reference to the tables 211 to 213 in the storage unit 2. Specifically, the estimated value operation unit 42 acquires, from the first to third tables 211 to 213, values (the first to third decrease rates) corresponding to the average load, the maximum load, and the ΔSOC obtained by the parameter operation unit 41 and the temperature detected by the detector 3 (step S3), and obtains (calculates) an estimated value of the decrease rate in accordance with the sum of the values (the sum of the decrease rates) (step S4).

The adjuster 5 subsequently controls current inputted to and outputted from the energy storage device 100 in accordance with the estimated value of the decrease rate. Specifically, the control is performed as follows.

The adjuster 5 determines whether or not the estimated value of the decrease rate is equal to or less than the threshold (2% in the present exemplary embodiment) (step S5). In a case where the adjuster 5 determines that the estimated value of the decrease rate is more than the threshold (No in step S5), the adjuster 5 adjusts the maximum load by varying the current (the current value) inputted to and outputted from the energy storage device 100 (step S6). The adjuster 5 according to the present embodiment decreases the current (the current value) inputted to and outputted from the energy storage device 100 by a preset value. The flow then returns to step S1, and steps S1 to S6 are repeated until the estimated value of the decrease rate becomes less than the threshold.

In another case where the adjuster 5 determines that the estimated value of the decrease rate is equal to or less than the threshold (Yes in step S5), the series of operation ends. The series of operation (operation from (START) to (END) in FIG. 5) is repeated while the input-output control device 1 is in operation.

According to the input-output control device 1 and the input-output control method for the energy storage device 100 described above, the current inputted to and outputted from the energy storage device 100 is adjusted in accordance with the temporary power decrease rate of the energy storage device 100 estimated from the current inputted to and outputted from the energy storage device 100 and the temperature of the energy storage device 100, to suppress the temporary power decrease rate of the energy storage device 100 to be equal to or less than the threshold (the predetermined value). This suppresses degradation of the energy storage device 100. The temporary power decrease rate of the energy storage device 100 can be obtained (estimated) from the current inputted to and outputted from the energy storage device 100 in use and the temperature of the energy storage device 100. The current having the correspondence relation with the temporary power decrease rate is adjusted in accordance with the temporary power decrease rate thus obtained (estimated), to suppress the temporary power decrease rate of the energy storage device 100 to be equal to or less than the threshold (the predetermined value). This effectively suppresses degradation of the energy storage device 100 due to transition of temporary power decrease to permanent power decrease.

According to the input-output control device 1 and the input-output control method of the present embodiment, the storage unit preliminarily stores the first to third tables 211 to 213 (i.e. the data associating the average load, the maximum load, and the ΔSOC, with the temperature of the energy storage device 100 and the temporary power decrease rate of the energy storage device 100). The estimated value of the decrease rate can be acquired only with reference to the first to third tables 211 to 213 if the average load, the maximum load, and the ΔSOC of the energy storage device 100 and the temperature of the energy storage device 100 are available. This effectively suppresses an amount of operation to obtain the estimated value of the temporary power decrease rate in accordance with the current and the temperature thus detected (i.e. the amount of operation to obtain the estimated value of the decrease rate in accordance with the average load, the maximum load, and the ΔSOC, as well as the temperature of the energy storage device).

A second embodiment of the present invention will be described next with reference to FIGS. 6 and 7. Configurations similar to those according to the first embodiment will be denoted by identical reference signs and will not be detailed repeatedly. Only different configurations will be described in detail.

Figure 6:
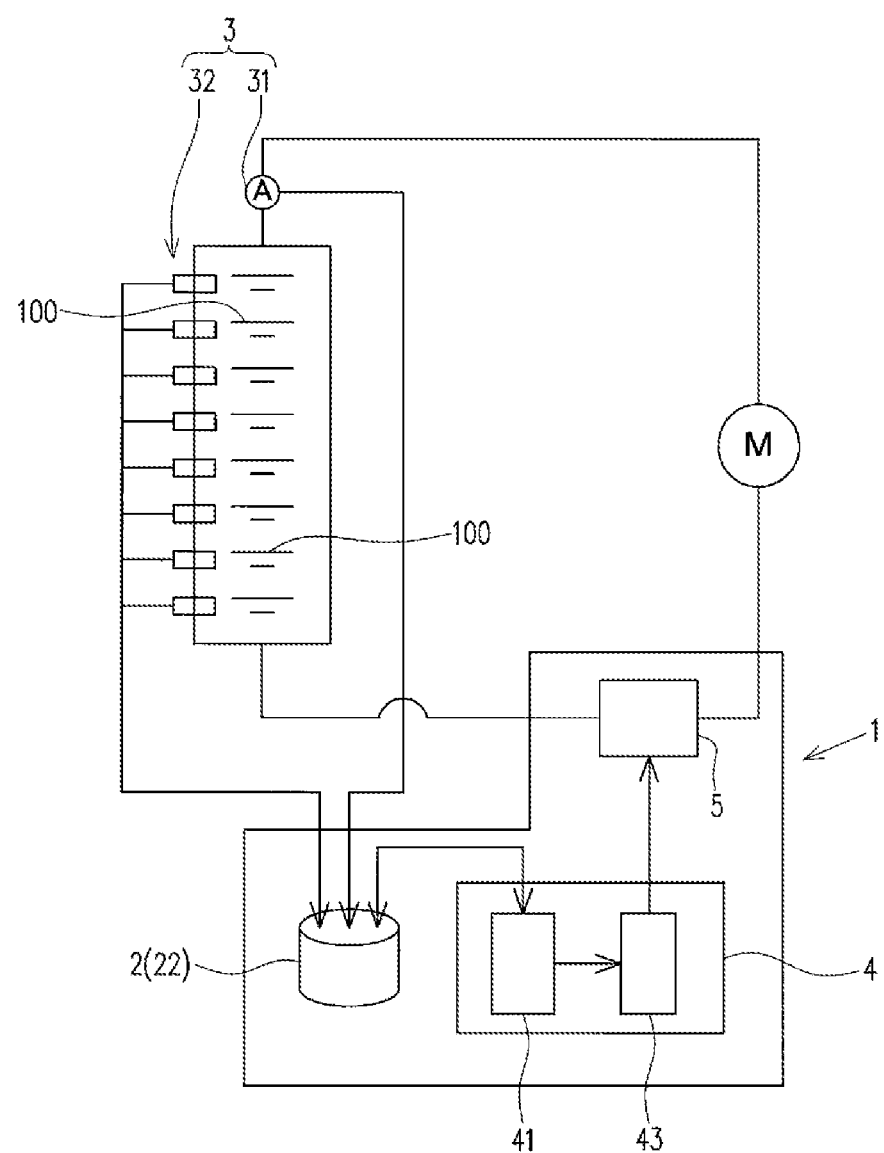
FIG. 6 is a schematic configuration diagram of an input-output control device according to a second embodiment.

As depicted in FIG. 6, an input-output control device includes the detector 3, the operation unit 4 (degradation estimator), and the adjuster 5. The input-output control device 1 further includes the storage unit 2 and the like.

The storage unit 2 is embodied by a hard disk, a memory, or the like, and has the second area 22 storing various drawable data (information) (i.e. configured to temporarily store received data).

The operation unit (degradation estimator) 4 includes a first operation unit 41 configured similarly to the parameter operation unit 41 of the first embodiment, and a second operation unit 43 configured to calculate an estimated value of a decrease rate by operation according to a parameter obtained by the first operation unit 41.

The second operation unit 43 calculates a corresponding one of the first to third decrease rates by operation, from at least one of an average load, a maximum load, and a ΔSOC obtained by the parameter operation unit 41. The second operation unit 43 obtains a sum of the calculated first to third decrease rates and calculates an estimated value of the decrease rate in accordance with the sum. For example, the second operation unit 43 calculates an estimated value D (≥0) of the decrease rate in accordance with the following equation (1).

[Expression 1]

$$D=\alpha(T)A+\beta(T)B+\gamma(T)C-K(T)E+Dstop \quad (1)$$

In the equation, A denotes a maximum load, B denotes an average load, C denotes a ΔSOC, E denotes pause time (time from charge-discharge current of the energy storage device becoming zero to start of charge-discharge of the energy storage device; a time interval from ignition off to ignition on), and T denotes temperature of the energy storage device. The average load has an average current value (a time average value of charge current and discharge current) in a time interval from ignition on to estimation of the temporary power decrease rate of the energy storage device, and is reset upon ignition off. The ΔSOC indicates a difference between a maximum SOC and a minimum SOC in the time interval from ignition on to estimation of the temporary power decrease rate of the energy storage device, and is reset upon ignition off. In the equation, α(T) denotes a coefficient on the maximum load, β(T) denotes a coefficient on the average load, and γ(T) denotes a coefficient on the ΔSOC. The coefficients α(T), β(T), and γ(T) increase as the time interval (cycle time) from ignition on to ignition off is longer. In the equation, K(T) denotes a relaxation coefficient, and Dstop denotes a temporary power decrease rate D immediately before vehicle stop. As to be described later, WOUT(MAX) denotes a vehicle initial set value (a current value of maximum input-output of the energy storage device), p(T) denotes a maximum load restriction coefficient (a maximum current restriction coefficient), and q(t) denotes an average load restriction coefficient (an average current restriction coefficient). Temporary power decrease is more significant in an earlier stage of cycle time, and gradually becomes less significant. The temporary power decrease varies in an inverted parabolic curve shape with respect to elapse of the cycle time. The temporary power decrease recovers more significantly in an earlier stage of pause time, and gradually recovers less significantly. The temporary power decrease varies in a parabolic curve shape with respect to elapse of the pause time.

In the equation (1), the first decrease rate corresponds to a term of α(T)A, the second decrease rate corresponds to a term of β(T)B, and the third decrease rate corresponds to a term of γ(T)C.

The adjuster 5 adjusts current inputted to and outputted from the energy storage device 100 such that the estimated value of the decrease rate obtained by the operation unit 4 is equal to or less than a threshold. The adjuster 5 according to the present embodiment determines whether or not the estimated value of the decrease rate is equal to or less than a first threshold (e.g. 2%). If the estimated value exceeds the first threshold, the adjuster 5 adjusts the current inputted to and outputted from the energy storage device 100, and then determines whether or not the estimated value of the decrease rate obtained by the second operation unit 43 is equal to or less than a second threshold (e.g. 3%). If determining that the estimated value of the decrease rate exceeds the second threshold, the adjuster 5 further adjusts the current inputted to and outputted from the energy storage device 100.

Control of input and output of the energy storage device 100 by the input-output control device 1 will be described next with reference also to FIG. 7.

When a hybrid vehicle starts due to ignition on, the input-output control device 1 mounted on the vehicle also starts operation. The detector 3 accordingly starts detecting current inputted to and outputted from each of the energy storage devices 100 (step S11). The first operation unit 41 then calculates an SOC of the energy storage device in accordance with the current detected by the detector 3 (step S12), and subsequently calculates an average load, a maximum load, and a ΔSOC (step S13).

The detector 3 then detects temperature of the energy storage device 100 (step S14), the second operation unit 43 calculates the estimated value D of the decrease rate from the detected temperature as well as the average load, the maximum load, and the ΔSOC calculated by the first operation unit 41, in accordance with the equation (1) (step S15). The adjuster 5 subsequently determines whether or not the estimated value D of the decrease rate is less than the first threshold (2% in the present exemplary embodiment) (step S16). In a case where the adjuster 5 determines that the estimated value D of the decrease rate is more than the first threshold (No in step S16), the adjuster 5 causes a value WOUT(T) of current inputted to and outputted from the energy storage device to be less than WOUT(MAX), and sets again to satisfy WOUT(T)=WOUT(MAX) as well as p(T)A, p(T)<1 (step S17).

In the changed setting, the second operation unit 43 calculates the estimated value D of the decrease rate in a manner similar to steps S11 to S15 (step S18). If the adjuster 5 determines that the estimated value D of the decrease rate is more than the second threshold (No in step S19), the adjuster 5 causes WOUT(T) to be less than WOUT(MAX) and causes the value A to be less than the value in step S17, and sets again to satisfy WOUT(T)=WOUT(MAX) as well as p(T)A, q(T)B, q(T)<1 (step S20). The series of operation then ends.

In another case where the adjuster 5 determines that the estimated value D of the decrease rate is equal to or less than the first threshold in step S16 (Yes in step S16), the series of operation ends. Furthermore, if the adjuster 5 determines that the estimated value D of the decrease rate is equal to or less than the second threshold in step S19 (Yes in step S19), the series of operation ends.

Figure 7:
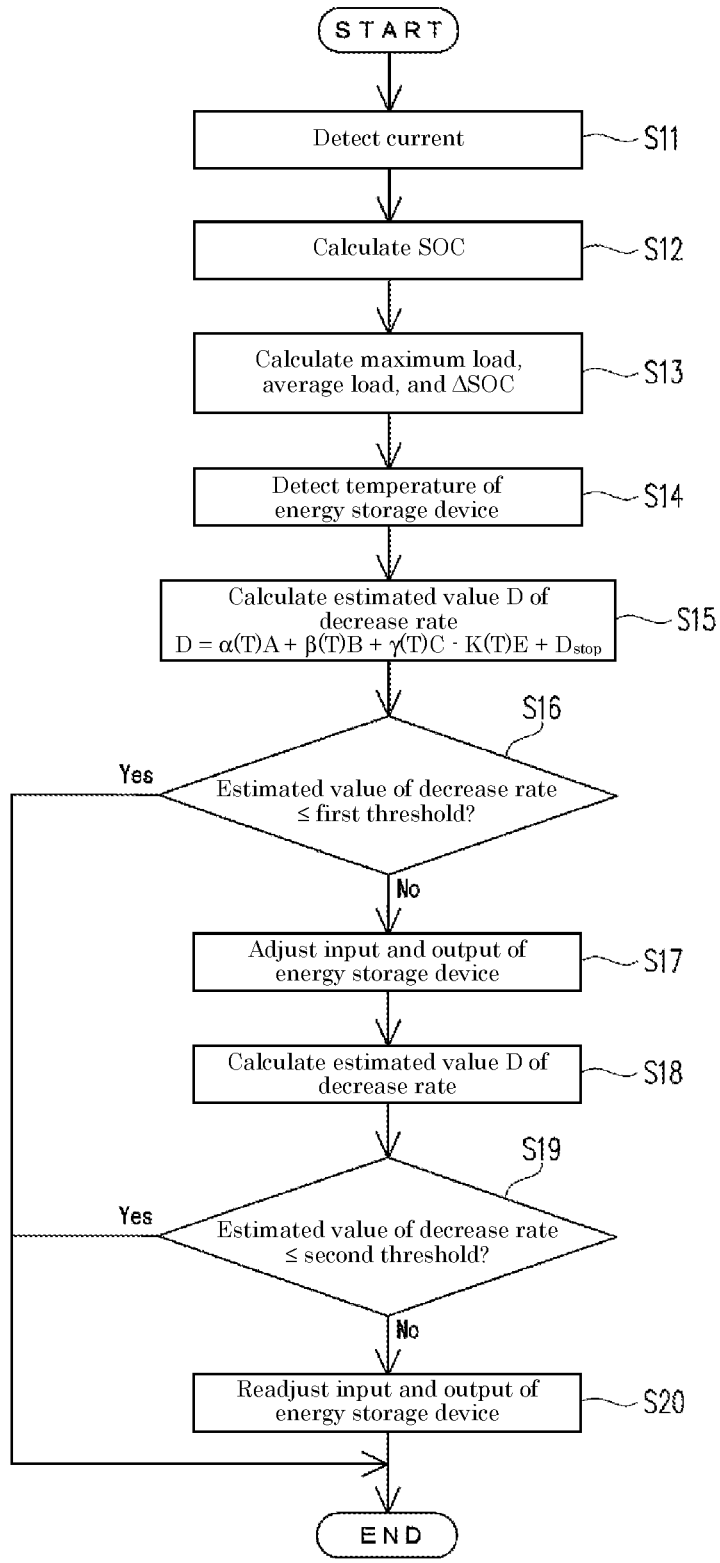
FIG. 7 is a flowchart depicting a flow of controlling an energy storage device by the input-output control device.

The series of operation (operation from (START) to (END) in FIG. 7) is repeated while the input-output control device 1 is in operation. When the hybrid vehicle stops due to ignition off, the second operation unit 43 stores, in the storage unit 2, the estimated value Dstop of the decrease rate immediately before stop, and refers thereto upon obtaining the estimated value D of the decrease rate when the hybrid vehicle starts next (i.e. the estimated value Dstop of the decrease rate immediately before stop is included in the equation (1)).

Similarly to the first embodiment, according to the input-output control device 1 and the input-output control method for the energy storage device 100, the current inputted to and outputted from the energy storage device 100 is adjusted in accordance with the temporary power decrease rate of the energy storage device 100 estimated from the current inputted to and outputted from the energy storage device 100 and the temperature of the energy storage device 100, to suppress the temporary power decrease rate of the energy storage device 100 to be equal to or less than the predetermined value. This effectively suppresses degradation of the energy storage device 100.

According to the input-output control device 1 and the input-output control method of the present embodiment, the temporary power decrease rate D is obtained (estimated) by operation (operation in accordance with the equation (1) in the present exemplary embodiment) with the current and the temperature thus detected (specifically, at least one of the average load, the maximum load, and the ΔSOC obtained from the current, and the temperature). The storage unit 2 thus does not need to have an area or the like storing the data associating the average load, the maximum load, and the ΔSOC, with the temperature of the energy storage device 100 and the temporary power decrease rate of the energy storage device 100. This leads to simplification in configuration.

The input-output control device and the input-output control method according to the present invention are not limited to those according to the above embodiments, but can obviously be modified in various manners within a scope not departing from the gist of the present invention.

For example, a configuration according to an embodiment can additionally be provided with a configuration according to another embodiment, or a configuration according to an embodiment can partially be replaced with a configuration according to another embodiment. Furthermore, a configuration according to an embodiment can be removed partially.

According to the first and second embodiments, the threshold to be compared with the estimated value of the temporary power decrease rate of the energy storage device 100 is 2% or 3%. The threshold is, however, not limited to any specific value. The threshold is appropriately set in accordance with the relation indicated in FIG. 8 (specifically, increase in temporary power decrease rate leads to more influence of temporary power decrease on permanent power decrease). In this case, a threshold set in consideration of a measurement error leads to secure suppression of influence of temporary power decrease on permanent power decrease.

According to an energy storage apparatus 1 and the input-output control method of the first and second embodiments, the average load, the maximum load, and the ΔSOC obtained from the detected current, as well as the temperature are used for obtainment of the estimated value of the decrease rate. The present invention is, however, not limited to this case. As indicated in FIGS. 9 to 12, the values of the average load, the maximum load, the ΔSOC, and the temperature each have a correspondence relation with the value of the temporary power decrease rate. Alternatively, the estimated value of the decrease rate can be obtained with use of at least one of the average load, the maximum load, the ΔSOC, and the temperature, and the current inputted to and outputted from the energy storage device 100 can be adjusted in accordance with the estimated value.

Figure 14:
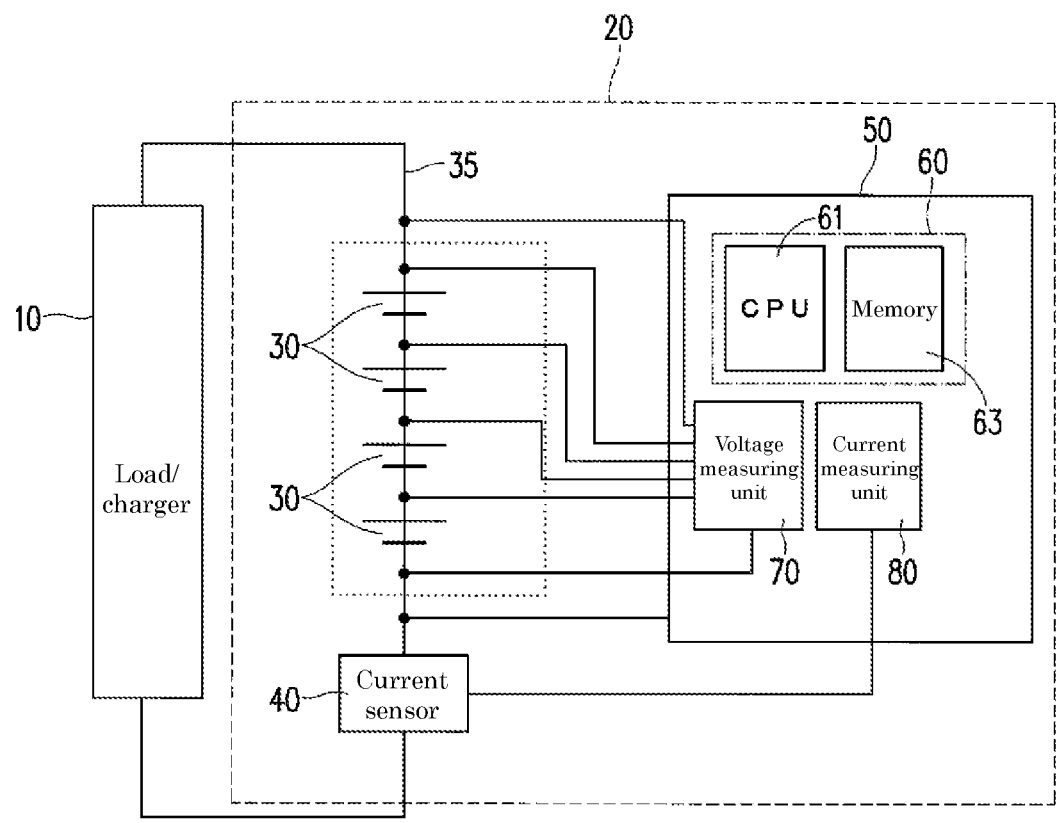
FIG. 14 is a block diagram of a battery module (energy storage apparatus) according to a different embodiment.

FIG. 14 is a block diagram of a battery module (an energy storage apparatus) according to a different embodiment. A battery module 20 can include a plurality of nonaqueous electrolyte energy storage devices 30 connected in series, a battery manager 50 configured to manage the energy storage devices 30, and a current sensor 40 configured to detect current flowing to the energy storage devices 30. The battery module is charged by a charger 10 and supplies direct current power to an inverter (a load 10) configured to drive a vehicle driving motor. The energy storage devices 30 can be lithium ion batteries including a negative active material such as a graphite-based material and a positive active material such as an iron phosphate-based material like $LiFePO_4$.

The battery manager 50 includes a controller 60, a voltage measuring unit 70, and a current measuring unit 80. The controller 60 includes a central processing unit (CPU) 61 and a memory 63. The memory 63 stores various programs for control of operation (operation depicted in FIG. 5 or 7) of the battery manager 50. The battery manager 50 can include a single or a plurality of substrates provided with various devices.

The voltage measuring unit 70 is connected to both ends of each of the energy storage devices 30 via voltage detection lines, and measures voltage V (V) of each of the energy storage devices 30 every time a predetermined period elapses. The current measuring unit 80 measures current flowing to the energy storage devices 30 with use of the current sensor 40.

The battery module 20 can be applied to drive an electric motor vehicle such as an electric vehicle (EV), a hybrid electric vehicle (HEV), or a plug-in hybrid electric vehicle (PHEV). There can be provided an alternator configured to charge for a short period of time with large current (e.g. at 5 CA to 10 CA for 10 to 30 seconds).

The battery module 20 can be configured as a battery pack including the energy storage device 30, the current sensor 40, and the battery manager 50 accommodated in a single container. The battery pack can be a 12V power source mounted on a movable body such as a vehicle, a train, a vessel, or an airplane and used for engine start. The battery pack mounted on the vehicle is preferred to assist driving the vehicle or supply power to an auxiliary machine.

The battery module 20 or the battery pack can be a 48V power source configured to assist driving the vehicle or supply power to an auxiliary machine.

Described below is specific exemplary use of the battery module 20 or the battery pack assisting driving the vehicle and supplying power to an auxiliary machine.

Exemplary use of the battery module 20 or the battery pack for assistance of driving the vehicle includes EV travel, EV travel at low speed (upon parking or in a traffic jam), engine start, engine restart from a stopped state during idle, regeneration upon decrease in speed, electric boost (motor assist), and electric turbocharge.

Exemplary use of the battery module 20 or the battery pack for power supply to an auxiliary machine includes power supply to an air conditioner, power supply to an electric stabilizer, power supply to a defogger, and power supply to a drive assist system or for automatic drive.

The maximum load (maximum current) is likely to increase when the battery module 20 or the battery pack is provided to assist driving the vehicle.

The average load (average current) is likely to increase when the battery module 20 or the battery pack is provided for power supply to the auxiliary machine. The average load is likely to increase in an exemplary case where the battery module 20 or the battery pack continuously supplies power to an auxiliary machine having large power consumption like an air conditioner and assists driving the vehicle in a travel pattern with short vehicle stop time.

FIG. 14 exemplifies a case where the controller 60 is accommodated in a container accommodating the energy storage devices 30. The present invention is, however, not limited to this case. The controller can alternatively be disposed apart from the energy storage devices. For example, the controller mounted on the vehicle can function as a controller for the degradation estimator.

Figure 15:
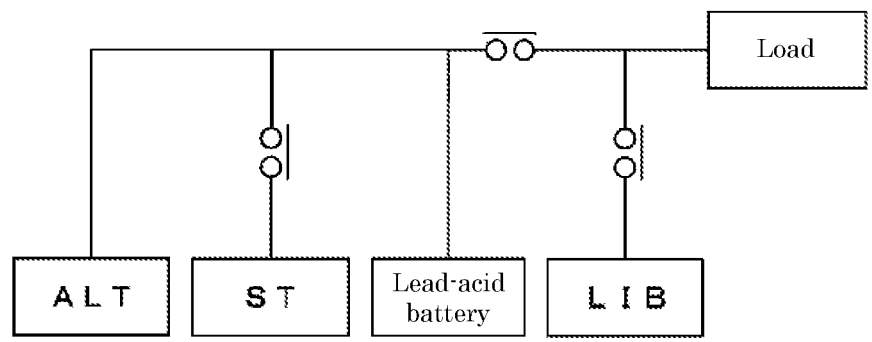
FIG. 15 is an explanatory view on a method for controlling input and output of an energy storage device according to a different embodiment.

FIG. 15 exemplifies a vehicle provided with an alternator ALT, a starter motor ST, a lead-acid battery (an auxiliary energy storage device or an auxiliary energy storage apparatus) functioning as a 12V power source, and a lithium ion battery LIB (an energy storage device or an energy storage apparatus) functioning as a 12V power source or a 48V power source. The lead-acid battery supplies electric power to a load (e.g. an auxiliary machine) while current inputted to and outputted from the lithium ion battery LIB is adjusted such that an estimated value of a temporary power decrease rate of the lithium ion battery LIB is equal to or less than a predetermined value under the control depicted in FIG. 5 or 7. Alternatively, electric power from the lead-acid battery is preferentially supplied to the load (e.g. the auxiliary machine). Such a control method is useful particularly under a low temperature condition where a lithium ion battery is likely to have temporary power decrease. The auxiliary energy storage device (or the auxiliary energy storage apparatus) is not limited to the lead-acid battery but can alternatively be a battery of a different type or a capacitor. The auxiliary energy storage device is preferred to be an energy storage device other than the lithium ion battery in order for redundancy.

The invention claimed is:

1. A degradation estimator for an energy storage device, comprising:
a first operation unit configured to obtain at least a maximum load from detected current of the energy storage device,
wherein the degradation estimator estimates a temporary power decrease rate of the energy storage device in accordance with the maximum load and detected temperature of the energy storage device, and
wherein the temporary power decrease rate of the energy storage device comprises a difference between power decreased by application of a load to the energy storage device and power recovered from the state where the load is applied under the unloaded condition of the energy storage device for a predetermined period.

2. The degradation estimator according to claim 1, wherein
the first operation unit further obtains an average load from the detected current of the energy storage device, and
the degradation estimator estimates a temporary power decrease rate of the energy storage device in accordance with the maximum load, the average load, and the temperature.

3. The degradation estimator according to claim 2, wherein
the first operation unit further obtains a ΔSOC from the detected current of the energy storage device, and
the degradation estimator estimates a temporary power decrease rate of the energy storage device in accordance with the maximum load, the average load, the ΔSOC, and the temperature.

4. The degradation estimator according to claim 3, further comprising:
a second operation unit which estimates the temporary power decrease rate of the energy storage device by:
obtaining a sum of the temporary power decrease rate of the energy storage device corresponding to the average load, the temporary power decrease rate of the energy storage device corresponding to the maximum load, and the temporary power decrease rate of the energy storage device corresponding to the ΔSOC; and
estimating the temporary power decrease rate of the energy storage device based on the sum.

5. An energy storage apparatus comprising:
the energy storage device; and
the degradation estimator according to claim 1.

6. The energy storage apparatus according to claim 5, wherein
the electrode assembly includes a separator, and
the separator has air resistance of 100 to 300 sec/100 cc.

7. An input-output control device for an energy storage device, comprising:
a degradation estimator including a first operation unit configured to obtain at least one of an average load, a maximum load, and a ΔSOC from detected current of the energy storage device, the degradation estimator being configured to estimate a temporary power decrease rate of the energy storage device in accordance with at least one of the average load, the maximum load, and the ΔSOC obtained by the first operation unit and detected temperature of the energy storage device, wherein the input-output control device adjusts current inputted to and outputted from the energy storage device such that an estimated value of the temporary power decrease rate of the energy storage device obtained by the degradation estimator is equal to or less than a predetermined value, and wherein the temporary power decrease rate of the energy storage device comprises a difference between power decreased by application of a load to the energy storage device and power recovered from the state where the load is applied under the unloaded condition of the energy storage device for a predetermined period.

8. The input-output control device for the energy storage device according to claim 7, further comprising:

a storage unit storing data associating at least one of the average load, the maximum load, and the ΔSOC, with the temperature of the energy storage device and the temporary power decrease rate of the energy storage device; and an adjuster, wherein the degradation estimator obtains the estimated value from at least one of the average load, the maximum load, and the ΔSOC obtained by the first operation unit and the detected temperature, with reference to the data, and the adjuster adjusts current inputted to and outputted from the energy storage device such that the estimated value obtained by the degradation estimator is equal to or less than a predetermined value.

9. The input-output control device for the energy storage device according to claim 8, wherein the adjuster adjusts the current to adjust at least the maximum load out of the average load, the maximum load, and the ΔSOC.

10. The input-output control device for the energy storage device according to claim 8, wherein the predetermined value is from 0% to 10%.

11. The input-output control device for the energy storage device according to claim 7, further comprising:

an adjuster, wherein the degradation estimator includes a second operation unit configured to obtain the estimated value by operation with at least one of the average load, the maximum load, and the ΔSOC obtained by the first operation unit and the detected temperature, and the adjuster adjusts current inputted to and outputted from the energy storage device such that the estimated value obtained by the second operation unit is equal to or less than a predetermined value.

12. The input-output control device of claim 7, further comprising:

a detecting device comprising a current detector which detects the current inputted to and outputted from the energy storage device.

13. The input-output control device of claim 12, wherein the detecting device further comprises a temperature detector which detects the temperature of the energy storage device.

14. The input-output control device of claim 7, further comprising:

an adjuster which adjusts the current inputted to and outputted from the energy storage device based on the estimated temporary power decrease rate of the energy storage device.

15. The input-output control device of claim 14, wherein after the adjuster adjusts the current inputted to and outputted from the energy storage device:

the degradation estimator estimates an other temporary power decrease rate of the energy storage device; and the adjuster adjusts the current inputted to and outputted from the energy storage device based on the other estimated temporary power decrease rate of the energy storage device.

16. A battery module, comprising:

the energy storage device; and a battery manager which manages the energy storage device and comprises the input-output control device of claim 7.

17. A method for controlling input and output of an energy storage device, the method comprising detecting current inputted to and outputted from the energy storage device;

detecting temperature of the energy storage device;

obtaining an estimated value of a temporary power decrease rate of the energy storage device in accordance with at least one of an average load, a maximum load, and a ΔSOC obtained from the detected current, and the detected temperature; and adjusting current inputted to and outputted from the energy storage device such that the obtained estimated value of the temporary power decrease rate is equal to or less than a predetermined value, wherein the temporary power decrease rate of the energy storage device comprises a difference between power decreased by application of a load to the energy storage device and power recovered from the state where the load is applied under the unloaded condition of the energy storage device for a predetermined period.

18. The method for controlling input and output of the energy storage device according to claim 17, wherein obtaining the estimated value includes:

obtaining at least one of the average load, the maximum load, and the ΔSOC of the energy storage device from the detected current, and obtaining the estimated value from at least one of the average load, the maximum load, and the ΔSOC thus obtained and the detected temperature, with reference to preset data associating at least one of the average load, the maximum load, and the ΔSOC with the temperature of the energy storage device and the temporary power decrease rate of the energy storage device.

19. The method for controlling input and output of the energy storage device according to claim 17, wherein obtaining the estimated value includes:

obtaining at least one of the average load, the maximum load, and the ΔSOC of the energy storage device from the detected current, and obtaining the estimated value by operation with at least one of the average load, the maximum load, and the ΔSOC thus obtained and the detected temperature.

20. The method for controlling input and output of the energy storage device according to claim 17, the method further comprising supplying electric power from an auxiliary energy storage device or preferentially supplying electric power from the auxiliary energy storage device while current inputted to and outputted from the energy storage device is adjusted such that the obtained estimated value of the temporary power decrease rate is equal to or less than a predetermined value.

* * * * *